United States Patent [19]

Hethuin

[11] Patent Number: 4,728,957
[45] Date of Patent: Mar. 1, 1988

[54] DIGITAL FREQUENCY DISCRIMINATOR, FOR EXTRACTING A SINUSOIDAL SIGNAL

[75] Inventor: Serge Hethuin, Meudon La Foret, France

[73] Assignee: U.S. Philips Corporation, New York, N.Y.

[21] Appl. No.: 934,073

[22] Filed: Nov. 24, 1986

[30] Foreign Application Priority Data

Nov. 29, 1985 [FR] France ............................ 85 17684

[51] Int. Cl.⁴ .............................................. G01S 3/58
[52] U.S. Cl. .................................. 342/401; 329/110; 375/82
[58] Field of Search .......................... 342/401–406, 342/49; 364/451, 715, 735, 774, 807, 808; 375/82; 329/110, 126

[56] References Cited

U.S. PATENT DOCUMENTS

| | | | |
|---|---|---|---|
| 3,548,328 | 12/1970 | Breikss | 329/126 |
| 3,628,165 | 12/1971 | Swan, Jr. | 375/82 |
| 3,909,599 | 9/1975 | Trott, Jr. et al. | 375/82 X |
| 4,368,434 | 1/1983 | Miller et al. | 329/126 X |
| 4,455,533 | 6/1984 | Moraillon | 329/126 |
| 4,543,532 | 9/1985 | Kässer | 329/110 |
| 4,558,284 | 12/1985 | Zaidenweber | 329/126 |
| 4,560,941 | 12/1985 | Welles, II et al. | 375/82 X |
| 4,603,300 | 7/1986 | Welles, II et al. | 375/82 X |
| 4,656,431 | 4/1987 | Chapman | 375/82 X |

FOREIGN PATENT DOCUMENTS 1167168 5/1984 Canada ............................ 329/110
0125979 11/1984 European Pat. Off. ........... 375/82

Primary Examiner—Theodore M. Blum
Assistant Examiner—Bernarr Earl Gregory
Attorney, Agent, or Firm—Robert J. Kraus

[57] ABSTRACT

A digital frequency discriminator designed to extract from a carrier at frequency $f_o$ a low frequency sinusoidal signal modulating the carrier. It receives digital samples $x_n$ from the carrier modulated at the frequency $f_e = 4f_o$ and includes:
  means of accumulation of N samples $x_n$
  first means of storage of coefficients $R_{01}$, $R_{02}$, $R_{11}$ and $R_{12}$ defined by:

$$R_{ab} = \sum_{n=0}^{N-1} x_{n-a} \cdot x_{n-b}$$

means for formatting the coefficients $R_{ab}$, and
  first means of computing the quantity $a_1$ defined by:

$$a_1 = \frac{R_{02}R_{12} - R_{01}R_{22}}{R_{11}R_{22} - R_{12}^2}$$

the quantity $a_1$, similar to one point of the sought sinusoid, being then transferred into second means of storage, after which the next point of the sinusoid is determined from the next N samples.

8 Claims, 10 Drawing Figures

DIGITAL FREQUENCY DISCRIMINATOR, FOR EXTRACTING A SINUSOIDAL SIGNAL

BACKGROUND OF THE INVENTION

The present invention relates to a digital frequency discriminator intended for extracting from a carrier at a frequency of $f_o$ at least one low frequency sinusoidal signal, of frequency F, frequency modulating the said carrier with a modulating frequency excursion $\Delta F$, the values of $f_o$ and $\Delta F$ being known.

The present invention further relates to the use of a discriminator for determining the phase known as the reference phase contained in the composite VOR signal, received by an on-board VOR-ILS equipment, by point by point restoration of the 30 Hz sinusoidal signal giving the reference phase.

Most of the frequency discriminators used up to the present time are analog discriminators. They are used in particular in radio navigation. For example, in a radio altimeter of the linear frequency modulated continuous wave type, it is a known technique to hold the subtractive beat frequency $f_b$ between the transmitted wave and the received reflected wave at a constant set frequency $f_{bo}$ of predetermined value by including such a discriminator in the feedback system which controls the slope of the modulation line of the transmitted signal. This discriminator which has the function of providing, according to a substantially linear characteristic, the difference between the frequency $f_b$ and the set frequency, is basically formed of two processing systems each of which receives the signal to be discriminated. Each processing system includes a band pass filter, centered on $f_{bo}-\delta f$ (and centered on $f_{bo}+\delta f$ respectively), followed by an absolute value detector. The two signals thus obtained are subtracted from each other and the resultant signal is filtered through a low pass filter, An S-shaped characteristic amplitude-frequency curve is thus obtained whose central section, on either side of a phase shift equal to $\pi/2$, is substantially linear. From the work "Digital Signal Processing" by V. Capellini and A. G. Constantini, published by Elsevier Science Publishers B.V. (North Holland 1984), pages 632 to 637, the technique is known of digitally transposing the structure of the analog discriminator described above. The six components which form this structure are thus produced digitally, which obtains certain advantages such as ease of adjustment during mass production for example. In this way the previously mentioned S-shaped characteristic curve is again obtained. This digital discriminator has disadvantages: its linearity is limited. Also, the filtering thus achieved requires a large computing capacity and the result obtained, even if it is acceptable for a continuous frequency spectrum having a leading edge which it is sought to discriminate as is the case for the beat signal of a radio altimeter, has a lower performance when the discriminator of a single frequency line is desired, for example by demodulation of a VOR-ILS signal.

SUMMARY OF THE INVENTION

A purpose of the invention is to produce a digital discriminator enabling the reconstruction, with the help of a digital process, of at least one low frequency signal transmitted on a frequency modulated carrier.

Another purpose of the invention is to produce a digital discriminator having excellent linearity.

Yet another purpose of the invention is to reduce the amount of computations carried out by the digital discriminator.

These purposes are achieved due to the fact that the digital discriminator of the type specified in the opening paragraph according to the invention is characterized in that it receives, with or without prefiltering, digital samples $x_n$ of the said carrier modulated at a frequency $f_e$ such that $f_e = 4 f_o$, and in that it includes means of accumulation for accumulating between two successive dates $t_q$ and $t_{q+1}$ a number N, which can be set, of successive digital samples $x_n$ which form an analysis window. First means of storage for storing coefficients $R_{01}$, $R_{02}$, $R_{11}$, $R_{12}$ and $R_{22}$ defined by:

$$R_{01} = \sum_{n=0}^{N-1} x_n \cdot x_{n-1}$$

$$R_{02} = \sum_{n=0}^{N-1} x_n \cdot x_{n-2}$$

$$R_{11} = \sum_{n=0}^{N-1} x_{n-1}^2$$

$$R_{12} = \sum_{n=0}^{N-1} x_{n-1} \cdot x_{n-2}$$

$$R_{22} = \sum_{n=0}^{N-1} x_{n-2}^2$$

means of formatting the said coefficients, first means of computing the quantity $a_1$ defined by:

$$a_1 = \frac{R_{02}R_{12} - R_{01}R_{22}}{R_{11}R_{22} - R_{12}^2}$$

the quantity $a_1$ being similar, to the nearest multiplicative coefficient, to the ordinate of a point on the curve representing the said sought low frequency sinusoidal signal, and in that the value of $a_1$ is transferred into second means of storage, after which the next point of the said low frequency sinuosoidal signal is determined from the N samples which follow the data $t_{q+1}$.

The computations carried out in order to perform a point by point restoration of the said low frequency sinusoidal signal result from a choice of a simple second order mathematical model and simplifying assumptions explained in detail hereafter. The purpose of formatting the coefficients is to examine, for each restored point, whether the coefficients $R_{01}$, $R_{02}$, $R_{11}$, $R_{12}$ and $R_{22}$ have a sufficiently large value for the determination of the considered point to be able to be declared valid and, in the affirmative, to facilitate the subsequent computations carried out on these coefficients for determining the quantity $a_1$.

A preferred embodiment of the discriminator according to the invention is characterized in that it also includes second means of computing the quantity $a_2$ defined by:

$$a_2 = \frac{R_{01}R_{12} - R_{02}R_{11}}{R_{11}R_{22} - R_{12}^2}$$

the quantity $a_2$ being used as a convergence indicator and, in that for this purpose the said digital frequency discriminator includes means of comparison of the quantity $a_2$ with two thresholds $s_1$ and $s_2$ whose values can be set such that the quantity $a_1$ is only validated and transferred into the said second means of storage if: $s_1 < a_2 < s_2$.

The value to be given to $s_1$ and $s_2$ depends on the amplitude of the useful signal to be processed. In the moist frequency case, it is a microwave signal containing noise and, below a certain value of the signal/noise ratio, it is considered that the discrimination of a low frequency signal is no longer possible. The determination of the thresholds $s_1$ and $s_2$ therefore results from the test of the equipment depending on the power of the received useful signal and the power of the noise mixed with this signal.

A particularly useful use of the discriminator to a VOR signal as mentioned in paragraph 2 of the present document is according to the invention characterized by a sampling frequency, equal to 13280 Hz, applied to a carrier of 3320 Hz obtained by filtering the 9960 Hz carrier of the VOR signal through an analog one-way filter of order less than or equal to three whose pass band is between 0 and 10600 Hz and whose transition band extends between 10600 Hz and 15960 Hz, by sampling the signal obtained at the output of the one-way filter at a frequency of 26260 Hz and by filtering the samples through a half-band filter with 4 distinct coefficients whose high pass output is connected to the input of the said digital discriminator.

By thus lowering the sampling frequency by reducing the frequency of the carrier to one third of its value, the volume of computation that must be carried out by the digital discriminator is consequently lowered.

BRIEF DESCRIPTION OF THE DRAWING

The following description given with reference to the appended drawing figures, all given by way of example, will give a better understanding of how the invention can be carried out.

DESCRIPTION OF THE PREFERRED EMBODIMENTS

Figure 1:
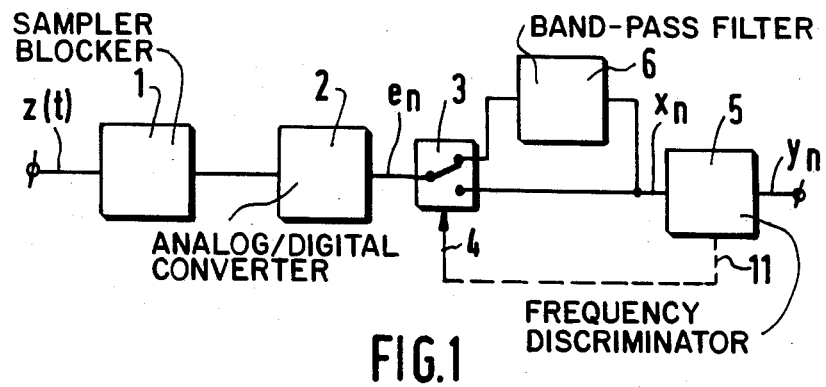
FIG. 1 is a block diagram of the signal processing system which includes a digital discriminator according to the invention.

The exact technical problem to be resolved consists in finding, using a digital process, a low frequency signal y(t) of frequency F transmitted by frequency modulation on a carrier at the frequency $f_o$. The low frequency modulating signal is written in simplified form as follows:

$$y(t) = a \sin(\omega t + \phi) \quad (1)$$

in which
a is the amplitude
$\omega = 2\pi F$ is the pulsation
$\phi$ is the phase at the origin.

In discrete form at the time of sampling i, the formula (1) can be written:

$$y_i = a \sin(2\pi F/f_e i + \phi)$$

$f_e$ being the sampling frequency, the inverse of the sampling period $\Delta T$.

The frequency modulation carried out on the carrier with a frequency excursion $\Delta F$ by y(t) is characterized as follows: the instantaneous frequency of the modulated carrier $f_{in}$ is expressed:

$$f_{in} = f_o + \Delta F y(t)$$

or again, in digital form:

$$f_n = f_o + \Delta F y_n \quad (2)$$

The phase at time t, $\Phi(t)$ is therefore:

$$\Phi = 2\pi f_o t + 2\pi F \int_0^t y(u) du$$

which can be written in discrete form at the sampling time n:

$$\phi_n = 2\pi \left( \frac{f_o}{f_e} n + \frac{\Delta F}{f_e} \sum_{i=0}^{n} y_i \right)$$

It will be noted that the phase at time n is connected to that at time (n−1) by a simple expression:

$$\Phi_n = \Phi_{n-1} + 2\pi/f_e f_n$$

The expression of the frequency modulated carrier is therefore:

$$z(t) = b \sin\{2\pi(f_o t + \Delta F \int_0^t y(u) du) + \alpha\}$$

or, if this signal is coded in digital form:

$$z_n = b \sin \left\{ 2\pi \left( \frac{f_o}{f_e} n + \frac{\Delta F}{f_e} \sum_{i=0}^{n} y_i \right) + \alpha \right\} \quad (3)$$

where b is the amplitude, and $\alpha$ is the phase at the origin.

It is desired to restore the successive $y_n$ i.e. the modulation signal. The basic assumption of the digital processing process of the signal explained below consists in making the approximation that the instantaneous frequency $f_n$ (see formula 2) does not vary over a short time interval with respect to: $T = 1/F$. In other words, the frequency $f_n$ for n such that: $N_o - N/2 \leq n \leq N_o + N/2$ is, to a first approximation, equal to a constant f if N is small. Under these conditions, the problem raised is summarized by the point by point estimation of a sinusoid. Therefore, if f is the value of frequency to be estimated and $\Omega = 2\pi f \Delta T$ is the associated pseudo-pulsation; the following can be written to a first approximation:

$$z_n b \sin(n\Omega + \alpha) \quad (4)$$

because of replacing $$\sum_{i=0}^{n} y_i \text{ by } ny_n$$

By virtue of the trigonometric formula:

$$\sin p + \sin q = 2 \sin\left(\frac{p+q}{2}\right) \cos\left(\frac{p-q}{2}\right)$$

where $p = n\Omega + \alpha$ and $q = (n-2)\Omega + \alpha$, the following emerges: $\sin(n\Omega + \alpha) + \sin\{(n-2)\Omega + \alpha\} = 2 \cos \Omega \sin\{(n-1)\Omega + \alpha\}$ or again $$z_n + z_{n-2} = 2 \cos \Omega z_{n-1} \tag{5}$$

The signals are received in a noisy environment and the problem consists in determining $\Omega$, and subsequently $y_n$ by virtue of the formula (2), under extremely variable conditions of signal to noise ratio S/N, this S/N ratio varying from 50 dB to 0 dB for example, from simple observations. For this, it is considered that each sample has noise and that at time $n\Delta T$:

$$z_n + b_n = x_n$$

is therefore obtained, $x_n$ being the digital sample of the input signal of the discriminator and $b_n$ the quantity of noise associated with this sample; this gives:

$$z_n = x_n - b_n$$

The expression (5) is then written:

$$x_n + x_{n-2} = 2 \cos \Omega x_{n-1} + \epsilon_n \tag{6}$$

or more precisely:

$$x_n + p^2 x_{n-2} = 2p \cos \Omega x_{n-1} + \epsilon_n \tag{6'}$$

expressions in which p is the modulus of a complex number, close to unity, and $\epsilon_n$ represents the quantity of noise coming from the original noise and filtered through a band pass filter centered on f:

$$\epsilon_n = b_n + b_{n-2} - 2 \cos \Omega b_{n-1} \tag{7}$$

The recurrence, relationship between three successive samples (6) or (6)', represents a second order modelling of the system which corresponds to the detection of a single modulation line in the input signal of the discriminator. It will be noted that, for an input signal with several modulation lines, it is also possible, by means of a more complex modelling of the system, by an order greater than 2, to achieve the discrimination of these multiple lines. However, the following description will keep to the discrimination of a single line.

In order to estimate $\Omega$ the use of a linear prediction expression is proposed, of the type:

$$x_n + a_1 x_{n-1} + a_2 x_{n-2} = \epsilon_n \tag{8}$$

the expression (8) being able to be identified term by term, with the expression (6) or (6)'.

The noise $\epsilon_n$ is considered white, gaussian and therefore not correlated with the sought useful signal y(t). The estimation depends on the accumulation of the quantities $\epsilon^2_n$ over a certain analysis window of N successive samples, which represent each time a point in the sought sinusoid, and on the minimization of the mean square error thus obtained, that is:

$$E = \sum_{n=0}^{n-1} \epsilon_n^2 \tag{9}$$

The minimization of E is expressed as:

$$\frac{\partial E}{\partial a_1} = 0, \text{ which produces: } \sum_{n=0}^{N-1} \epsilon_n x_{n-1} = 0$$

$$\frac{\partial E}{\partial a_2} = 0, \text{ which produces: } \sum_{n=0}^{N-1} \epsilon_n x_{n-2} = 0$$

By development, two equations to be solved simultaneously are therefore obtained:

$$\sum_{n=0}^{N-1} x_n x_{n-1} + a_1 \sum_{n=0}^{N-1} x_{n-1}^2 + a_2 \sum_{n=0}^{N-1} x_{n-1} x_{n-2} = 0 \tag{11}$$

$$\sum_{n=0}^{N-1} x_n x_{n-2} + a_1 \sum_{n=0}^{N-1} x_{n-1} x_{n-2} + a_2 \sum_{n=0}^{N-1} x_{n-2}^2 = 0$$

By putting $$R_{01} = \sum_{n=0}^{N-1} x_n x_{n-1}$$

$$R_{11} = \sum_{n=0}^{N-1} x_{n-1}^2$$

$$R_{12} = \sum_{n=0}^{N-1} x_{n-1} x_{n-2}$$

$$R_{02} = \sum_{n=0}^{N-1} x_n x_{n-2}$$

$$R_{22} = \sum_{n=0}^{N-1} x_{n-2}^2$$

the above set of equations (11) is more simply expressed:

$$R_{01} + a_1 R_{11} + a_2 R_{12} = 0$$

$$R_{02} + a_1 R_{12} + a_2 R_{22} = 0 \tag{12}$$

In the present case, the quantity $a_2$ must equal 1 and $p^2$ respectively if the expressions (6) and (8) or (6)' and (8) respectively are identified, but it is preferred to ignore this condition on first analysis and to use $a_2$ as what may be called a convergence indicator. This means that if the computed value of $a_2$ is too different from 1, it can be considered that there is too great a divergence and that the corresponding determination of $y_n$ must be rejected as being incorrect. Finally, this gives:

$$a_1 = \frac{R_{02} R_{12} - R_{01} R_{22}}{R_{11} R_{22} - R_{12}^2} \tag{13}$$

$$a_2 = \frac{R_{01} R_{12} - R_{02} R_{11}}{R_{11} R_{22} - R_{12}^2} \tag{14}$$

The determination of the quantities $a_1$ and $a_2$ is subject to particular operating conditions and certain characteristics are favourable to such an estimation:

Firstly, the coefficients $R_{11}$ and $R_{12}$ represent the autocorrelation coefficient $R_0$ which represents the power of the received signal and can be estimated over a wider horizon than the actual analysis window N on condition that there is standardization. For example, if N=64 is chosen, $R_0$ can be estimated over a window of 128 or of 256 points. The estimation window of $R_0$ must, however, remain rather narrow so that, for the time corresponding to this window, it can be considered that the signal has not been subject to a fluctuation in power.

Also essentially for reasons of simplicity of computation, a sampling frequency such that: $f_e=4f_0$ is preferably chosen. This choice also leads to optimum accuracy as demonstrated by the autoregressive methods in linear prediction theory. Thirdly, applications for which the frequency excursion of the modulating frequency $\Delta F$ is small compared with the carrier frequency $f_o$ are desired, for example by a value of $\Delta F$ of the order of 500 Hz for a value of $f_o$ of the order of 10,000 Hz. Finally the pass band of the modulating signal is considered as being small with respect to the carrier frequency $f_o$.

Under these conditions, the digital processing to be carried out consists in dividing the observation signal, that is to say the modulated carrier, into adjacent sections each containing N samples. Each section gives rise to the determination of a point of the sought sinusoid. For each section of the signal, the approximation is made that the frequency of the observation signal remains constant and:

$$a_2 = \frac{R_{01}R_{12} - R_{02}R_0}{R_0^2 - R_{12}^2} \quad (15)$$

is obtained.

For $f_e=4f_o$ and for $R_0$ standardized at 1, it can be verified over the trigonometric circle that:

$R_{01}$ tends to 0
$R_{12}$ tends to 0
and
$R_{02}$ tends to $-1$.

From this it is deduced that: $a_2 \approx 1$, which must be verified by measurements and computations. Similarly, $$a_1 = \frac{R_{02}R_{12} - R_{01}R_0}{R_0^2 - R_{12}^2} \quad (16)$$

is obtained, and $a_1$ tends to 0, the value of $a_1$, although small, not however being negligible. If reference is made to the formulae (6) and (8), $$a_1 = 2\cos\Omega \quad (17)$$

may be written.

The fact that $\cos\Omega$ is close to 0 can be used in a useful way by considering that $\Omega$ tends to $\pi/2$ and therefore:

$$\cos\Omega = \sin\left(\frac{\pi}{2} - \Omega\right) \neq \frac{\pi}{2} - \Omega \quad (18)$$

form formulae (16), (17) and (18) it results that:

$$\Omega - \frac{\pi}{2} = \frac{1}{2} \frac{R_{02}R_{12} - R_{01}R_0}{R_0^2 - R_{12}^2} \quad (19)$$

Now, the coming together of the formulae (3) and (4) under the assumption that: $f_e=4f_o$ enables the following to be written:

$$\Omega = \frac{\pi}{2} + \frac{\pi \Delta F}{2f_o} y_n \quad (20)$$

If, in this last formula, $\Omega$ is replaced by its value given by formula (19)

$$y_n = \frac{f_o}{\pi \Delta F} a_1 \quad (21)$$

$$y_n = \frac{f_o}{\pi \Delta F} \left( \frac{R_{02}R_{12} - R_{01}R_0}{R_0^2 - R_{12}^2} \right) \quad (22)$$

is obtained, in which formulae $y_n$ is the sought value of the modulating signal for the section concerned. Starting from formulae (6)' and (8), this results in a slightly more complicated but more rigorous computation at:

$$y_n = \frac{f_o}{\pi \Delta F} \frac{a_1}{\rho}$$

or $$y_n = \frac{f_o}{\pi \Delta F} \frac{a_1}{\sqrt{a_2}}$$

or again $$y_n = \frac{f_o}{\pi \Delta F} \frac{R_{02}R_{12} - R_{01}R_0}{\sqrt{(R_{01}R_{12} - R_{02}R_0)(R_0^2 - R_{12}^2)}} \quad (22)'$$

In practice it is preferable to use expression (22)' rather than expression (22) particularly as the computed value of $a_2$ moves further away from the value 1. Therefore, firstly the value of $a_2$ is calculated, using formula (15) and only if this value is sufficiently close to 1, which indicates correct convergence, and then the values of $a_1$ and $y_n$ are in their turn calculated using the formulae (16) and (22) or (22)' respectively.

It should be noted that insofar as the frequency excursion $\Delta F$ is no longer negligible with respect to the carrier frequency $f_0$, $\cos\Omega$ no longer tends to 0 and consequently it becomes preferable to proceed with the extraction of $\Omega$ using the arc-cos function.

It is also posssible to compute the noise power from the formulae (8) and (9); this gives:

$$\sum_{n=0}^{N-1} \epsilon_n^2 = \sum_{n=0}^{N-1} (x_n + a_1 x_{n-1} + a_2 x_{n-2})^2 \quad (23)$$

$$\sum_{n=0}^{N-1} \epsilon_n^2 = (R_{00} + a_1 R_{01} + a_2 R_{02}) +$$

$$a_1(R_{01} + a_1 R_{11} + a_2 R_{12}) + a_2(R_{02} + a_1 R_{12} + a_2 R_{22})$$

where $$R_{00} = \sum_{n=0}^{N-1} x_n^2$$

According to the set of equation 12, $$\sigma^2 = \frac{1}{N}\sum_{n=0}^{N-1}\epsilon_n^2 = \frac{1}{N}(R_{00} + a_1 R_{01} + a_2 R_{02}) \quad (24)$$

is obtained, $\sigma^2$ being the noise power which can be estimated by means of expression (24).

As regards the embodiment, it will be noted that the expression (22) can be applied to an observation section of N points by computing the quantities $R_{01}$, $R_{02}$ and $R_{12}$ using the expressions:

$$R_{01} = \sum_{n=N_0}^{N_0+N-1} x_n x_{n-1}$$

$$R_{02} = \sum_{n=N_0}^{N+N-1} x_n x_{n-2}$$

$$R_{12} = \sum_{n=N_0}^{N_0+N-1} x_{n-1} x_{n-2}$$

$R_0$ being computed over a horizon which can be larger than N, namely L.

Another possibility consists in making a point by point recursive estimation using:

$$R_{01}(N_0+1) = R_{01}(N_0) + x_{N_0+N} x_{N_0+N-1} - x_{N_0} x_{N_0-1}$$

$$R_{02}(N_0+1) = R_{02}(N_0) + x_{N_0+N} x_{N_0+N-1} - x_{N_0} x_{N_0-2}$$

$$R_{12}(N_0+1) = R_{12}(N_0) + x_{N_0+N-1} x_{N_0+N-2} - x_{N_0-1} x_{N_0-2}$$

$$R_0(N_0+1) = R_0(N_0) + x_{N_0+N}^2 - x_{N_0+N-L}^2$$

Figure 3:
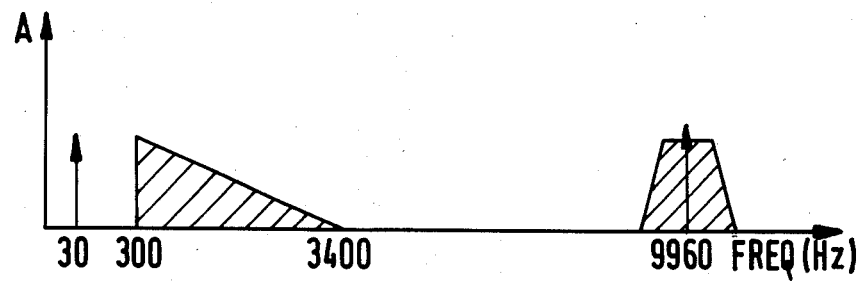
FIG. 3 shows the spectrum of a composite VOR signal.

This discriminator according to the invention is designed, preferably, to function with signal to noise ratio S/N conditions that are widely variable, for example between 0 and 50 dB. When the S/N ratio drops below 15 dB, the functioning of the system thus described can be further improved a little by carrying out a prefiltering about the useful discrimination band, i.e. about the modulated carrier before discrimination about the frequency $f_o$, on the assumption that: $f_o = f_e/4$. FIG. 1 shows the processing system of the signal including the digital discriminator according to the invention. The actual discriminator is preferably produced by means of a microprocessor as described below for the application of the invention to a composition VOR signal, such as shown in FIG. 3. The frequency modulated signal z(t) is supplied to a sampler-blocker 1 of a known type which samples at the frequency $f_e$. The samples are then supplied to an analog/digital converter 2 whose output is the source of digital samples in serial form $e_n$. A two-position switch 3, that can be controlled by a control signal, on a conductor 4, depending on the value of the S/N ratio (this signal having a different logic value above and below a threshold S/N=S'), enables the samples $e_n$ to be transmitted in the form $x_n$ to the input of the digital frequency discriminator 5 either directly or through a filter 6 which is a band pass filter on the frequency $f_o$. An example of elementary band pass filtering centered on $f_o = f_e/4$ is given by the following expression:

$$x_n = \tfrac{1}{8}(e_n - e_{n-2} + e_{n-4} - e_{n-6} + e_{n-8} - e_{n-10} + e_{n-12} - e_{n-14}) \quad (25)$$

This filter, although rudimentary, enables the noise power to be attenuated by means of simple operations such as addition and subtraction. The estimation variance of the modulation signal is thus improved for low values of the S/N ratio. The table 1 below gives an appreciation of the estimation standard deviation results for a modulating signal of amplitude a=1 in the case of observation (analysis) windows of 24, 48 and 96 points, for various values of the S/N ratio expressed in steps of 10 dB and with (A) or without (S) pre-filtering for each of these values.

| S/N ratio | | Observation window | | |
|---|---|---|---|---|
| | | 24 | 48 | 96 |
| 50 dB | S | 0.011 | 0.004 | 0.006 |
| | A | 0.044 | 0.042 | 0.040 |
| 40 dB | S | 0.012 | 0.004 | 0.007 |
| | A | 0.044 | 0.042 | 0.040 |
| 30 dB | S | 0.023 | 0.010 | 0.011 |
| | A | 0.045 | 0.042 | 0.041 |
| 20 dB | S | 0.075 | 0.034 | 0.032 |
| | A | 0.055 | 0.043 | 0.043 |
| 10 dB | S | 0.32 | 0.18 | 0.16 |
| | A | 0.12 | 0.067 | 0.066 |
| 0 dB | S | 1.17 | 0.73 | 0.64 |
| | A | 0.32 | 0.19 | 0.18 |

Figure 2:
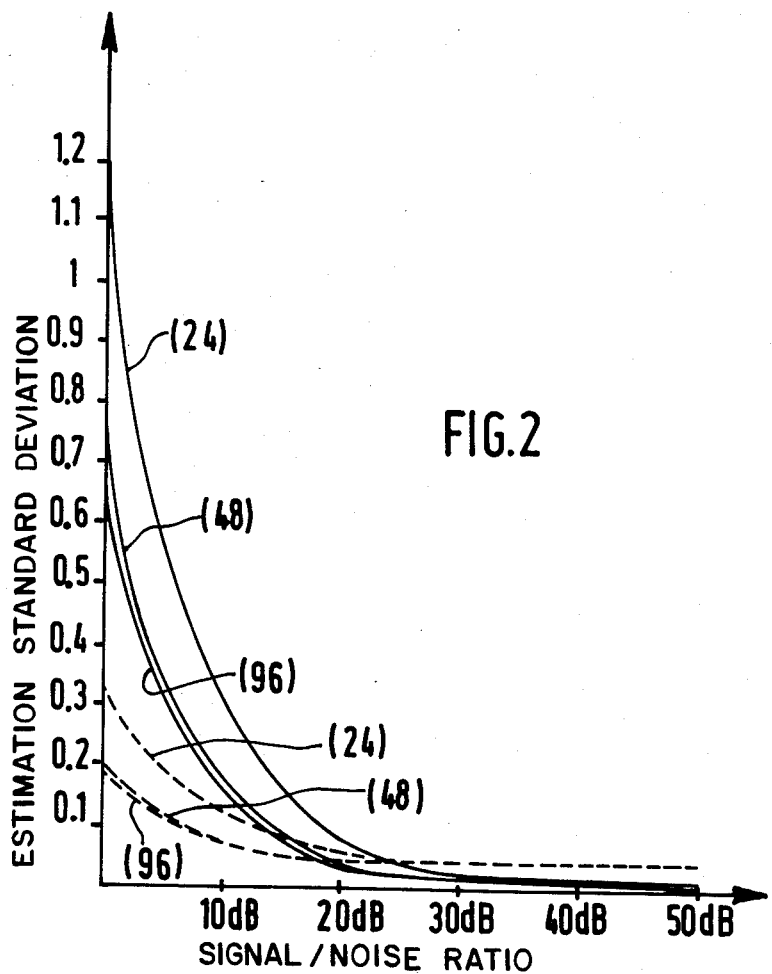
FIG. 2 shows curves of estimation variance as a function of the signal/noise ratio of the output samples of the discriminator for various analysis windows and depending on whether or not prefiltering is included.

FIG. 2 is a graph of the estimation standard deviation ESD given in the table, which represents the estimation variance as a function of the S/N ratio, the curves in full line indicating the discrimination without prefiltering and the curves in broken line indicating the discrimination with prefiltering; the number N of points in the observation window is indicated in brackets. This figure shows the effectiveness of the band pass filter between 15 dB and 0 dB where the standard deviation is particularly improved. Within this latter range of S/N ratio, the gain obtained on the S/N ratio with such a filter can be evaluated at 10 dB. FIG. 2 also shows that the number N must not be too small either as there is a risk of having too large an estimation standard deviation for the lowest values of the S/N ratio. Given the chosen values for various frequencies indicated above it is noted that the value N=24 would be too small while the values N=48 or N=96 are suitable. It is also possible to choose the value N=64 which, because it is a power of two, has the advantage of simplifying the computations.

It is proposed to apply the principle described above to the search for the reference phase in the VOR signal received by an on-board VOR-ILS equipment. The spectrum of the received composite signal A(FREQ.) is shown in FIG. 3. It contains a component at 30 Hz giving the variable phase, an audio band from 300 to 3400 Hz (or an identification signal at 1020 Hz), and a 9960 Hz carrier frequency modulated with an excursion of 480 Hz by the 30 Hz signal giving the reference phase. It is this frequency modulating 30 Hz signal that it is sought to restore.

Figure 4:
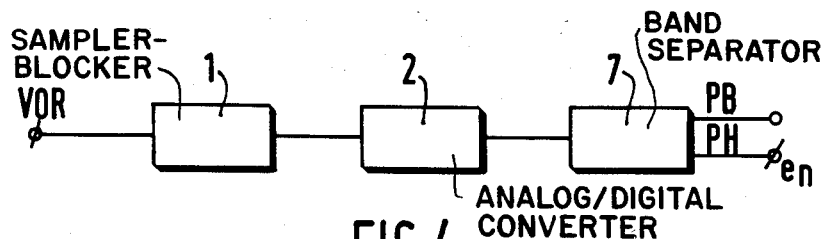
FIGS. 4 and 5 each show a processing system that can be used for an analog VOR signal up to the production of the input samples $e_n$ of FIG. 1.

A first solution for the application of the principle described above consists in sampling the VOR signal at a frequency of: 4×9960=39840 Hz, and then in separating the low sections of the spectrum (30 Hz component and audio signal) and the high sections (frequency modulated signal) and finally in applying the discrimination procedure to the 9960 Hz carrier. This latter frequency is equal to $f_e/4$ and the computation procedure indicated above correctly applies. The processing system which converts the analog VOR signal into the digital signal $e_n$ is shown in FIG. 4. It is formed by the succession of a sampler-blocker 1, an analog-digital converter 2, and a digital separator filter 7, of known type, whose high pass output, referenced PH, is the source of the signal $e_n$, at the same frequency as the input signal of the band separator 7. For the chosen frequency of $f_e$ at 39840 Hz, the volume of computation is large; it is advantageous to lower the sampling frequency.

Consequently, a second solution consists in starting by choosing a sampling frequency $f_{e1}$ such that:

$$f_{e1} = 8/3 \times 9960 = 26560 \text{ Hz}$$

Figure 6:
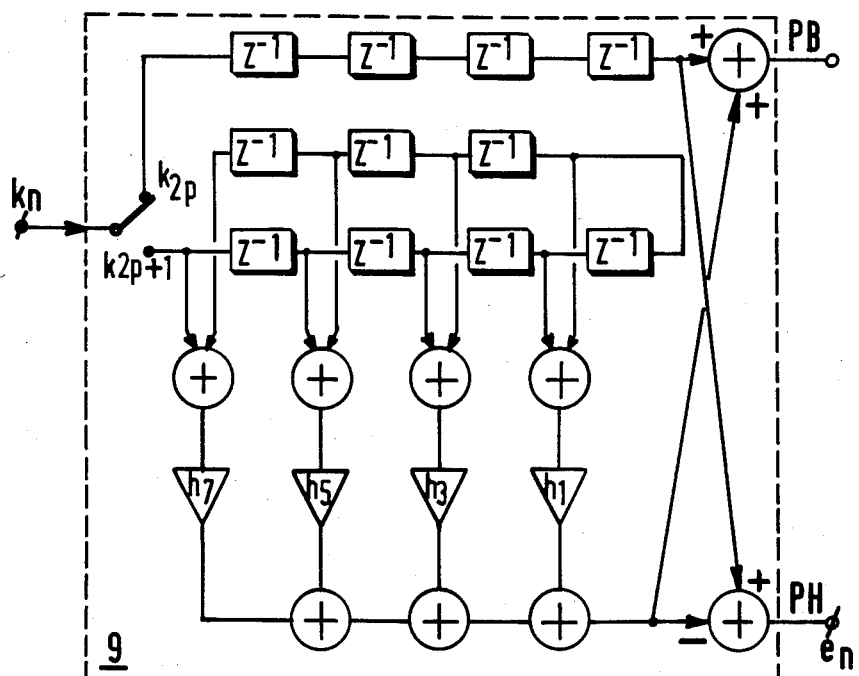
FIG. 6 shows a band separating digital filter preferably used in the processing system of FIG. 5.
Figure 5:
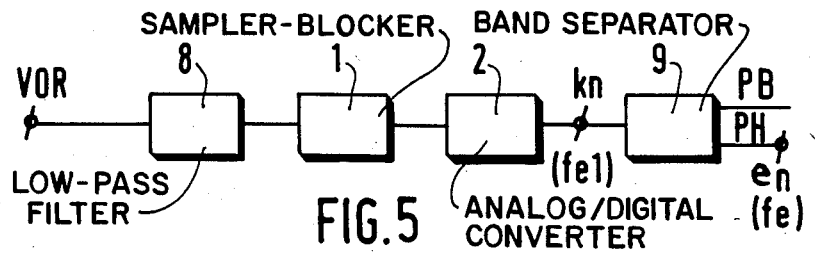

Before the sampling operation, the signal must in this case pass through an analog one-way filter in order to limit the maximum frequency of the spectrum to a value below 13280 Hz (cut-off frequency: $f_c = f_{e1}/2$). As the high part of the VOR signal is frequency modulated with a nominal frequency excursion of 480 Hz and because of this extends to 10600 Hz, this one-way filter must have a pass band of 0 to 10600 Hz. The transition band is: $2(f_{e1}/2 - 10600) = 5360$ Hz and the attenuated band therefore extends from $10600 + 5360 = 15960$ Hz to infinity. The order of the filter is determined by the ratio between the transition band and the cut-off frequency, namely: 5360/13280, giving an order of less than or equal to three. The operation which follows the sampling consists in separating the low and high sections of the spectrum. To do this, a digital band separator filter which is preferably a half band filter with 4 separate coefficients such as is shown in FIG. 6 is used. The processing system for the signal ahead of the digital discriminator is then the one shown in FIG. 5, consisting of a low pass analog one-way filter 8, a sampler-blocker 1, an analog/digital converter 2 and a digital band separator filter 9 shown in more detail in FIG. 6. The filter 9 is a finite pulse response halfband transverse filter, of known type, it operates alternately on even samples $k_n$ ($n = 2p$) and odd samples $k_n(n = 2p+1)$, which is represented in FIG. 6 by a switch. This structure enables it to carry out a subsampling by two. It receives samples $k_n$ at the rate of 26560 Hz and supplies at its high pass output PH samples $e_n$ at the rate of 13280 Hz. The structure of the filter in FIG. 6 is designed to perform the following equation:

$$e_n = k_{n-8} - h_1(k_{n-7} + k_{n-9}) -$$
$$h_3(k_{n-5} + k_{n-11}) - h_5(k_{n-3} + k_{n-13}) -$$
$$h_7(k_{n-1} + k_{n-15})$$

The delays $z^{-1}$ shown in FIG. 6 are at the output rate, that is $f_{e1}/2$.

The response is therefore symmetrical on either side of a main coefficient and equal to 1 with the odd coefficients only, the even coefficients being zero. Because of the sub-sampling by two, the PH output is transposed by 13280 Hz, that is $f_{e1}/2$, and the new carrier before discrimination is at a frequency of 3320 Hz $(13280 - 9960 = 3320$ Hz); in effect, the sub-sampling by two gives, for the spectrum of the VOR signal shown in FIG. 3, a symmetrical image with respect to $f_{e1}/2$ and, after shifting to the left by 13280 Hz, the section of the spectrum to be processed, i.e. the frequency modulated carrier is centered about the frequency 3320 Hz. It is therefore noted that the new sampling frequency to be considered for the discriminator 5 is: $f_e = f_{e1}/2 = 13280$ Hz, or four times 3320 Hz. In other words, the high pass output is in the required condition to be processed by the previously described discrimination procedure. More generally, using the processing system in FIG. 5, the reduced sampling frequency is deduced from the expression:

$$f_e = f_o/3 + f_o,$$

or:

$$f_e = 4/3 f_o.$$

The sampling frequency is therefore reduced to one third of its value with respect to the first solution, with everything happening as if the carrier frequency were itself divided by three. In this particular case, either the limited development of the expression (18) or the Arc cos function which slightly complicates the computations but provides greater accuracy may be used, equally, for the calculation of $\Omega$ and subsequently of $y_n$.

The samples $e_n$ and subsequently $x_n$ (see FIG. 1) are then processed by a microprocessor, preferably a TMS 31010 made by the Texas Instruments Company, in order to carry out the computations mentioned above. The discriminator according to the invention is therefore entirely formed by a microprocessor, preferably provided with auxiliary memories, this microprocessor also being able to incorporate in the case of the VOR application at reduced sampling frequency, the band separator digital filter 7 and also, if appropriate, the digital filter 6.

The basic function of the digital discriminator 5 (see FIG. 1) is to determine the value $y_n$ by the expression (22) above, from a predetermined number N of consecutive samples $x_n$ taken between dates $t_q$ and $t_{q+1}$, after which the next value of $y_n$ determined from the subsequent N samples $x_n$ is proceeded to (between dates $t_{q+1}$ and $t_{q+2}$). In order to avoid confusion in notation, it is recalled that strictly speaking, each sample $x_n$ corresponds to a distinct sample $y_n$ but by approximation it is considered, section by section, that the values of the N consecutive output samples $y_n$ are equal, this common value being precisely written $y_n$ for convenience of notation. N output samples can therefore be replaced each time by their representative $y_n$ which corresponds to an output sampling reduced by the ratio N with respect to the input giving an output frequency of $f_e/N$. In the example described below the value of N is fixed at 64. Preferably, the sample $x_n$ are stored, in packets of 64, in an external RAM, hereafter referred to as the input-output port PA1 which forms means of accumulation of these input samples. Known buffer components and means of sequencing which are not shown enable the replacement of 64 input samples by the following 64 samples during a sequence of the computing program of $y_n$ following the reading of the samples, the processor working in real time.

Figure 7:
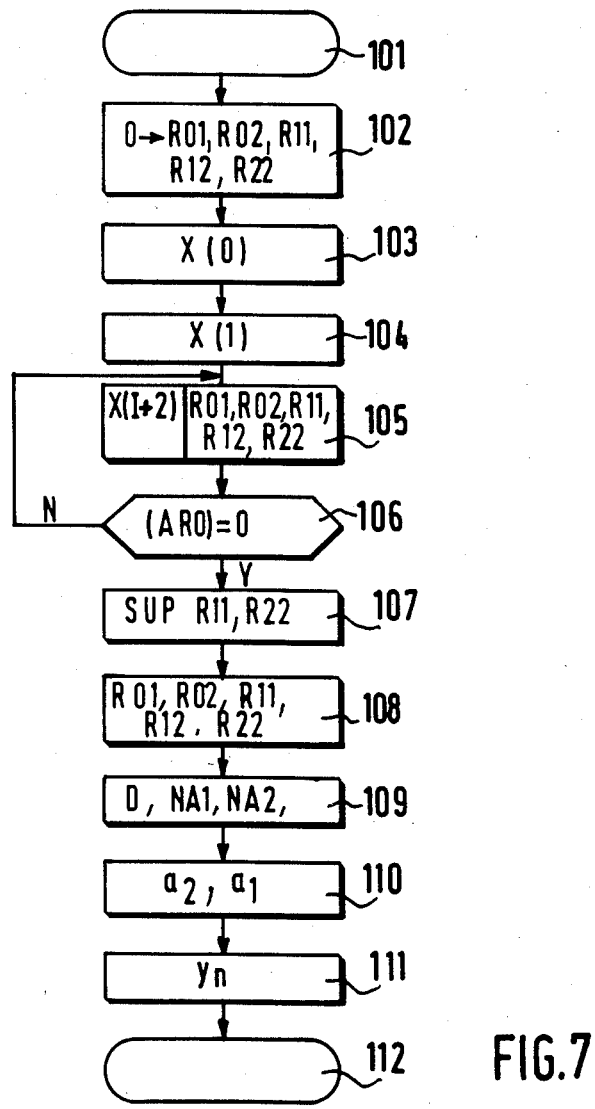
FIG. 7 is a general flowchart explaining the functioning of the discriminator according to the invention.

FIG. 7 shows the general functional flowchart of the discriminator according to the invention; this flow chart, as well as the following ones, is formed from various boxes. In FIG. 7, box 101 indicates the start of the program. In box 102, the necessary initializations are carried out which consist, for the samples $x_n$, in being set to read at the start of the memory area which contains them and, for the coefficients $R_{01}$, $R_{02}$, $R_{11}$, $R_{12}$ and $R_{22}$, in loading their respective memory boxes referenced R01, R02, R11, R12 and R22 with the value 0. The first two samples $x_0$ and $x_1$ are read (boxes 103 and 104) and then, by means of a loop computation (boxes 105 and 106), the following sample is read and the coefficients $R_{01}$ and $R_{22}$ are computed. In order to do this, the auxiliary register ARO which was previously loaded with the value 63 is used as a counter, being decremented by one unit on each pass through the loop, until the value 0 is reached which marks the end of the computation of the coefficients and commands the exit from the loop. In box 107 it is determined which is the biggest of the two coefficients $R_{11}$ and $R_{22}$, after which (box 108) the other coefficients are put into the format of the value found in the previous box. The quantities $R_{11} R_{22} - R_{12}^2$, $R_{02} R_{12} - R_{01} R_{22}$, $R_{01} R_{12} - R_{02} R_{11}$ which respectively form the common denominator of the coefficients $a_1$ and $a_2$, the numerator of $a_1$ and the numerator of $a_2$ are then computed, in box 110 and compared with predetermined threshold values, which enables the values of $a_1$ and $a_2$ to be declared as valid or non-valid depending on whether the convergence criteria already mentioned above and materialized by these thresholds can be considered as satisfactory or not satisfactory. The computation of the current output sample $y_n$ (box 111) may then be proceeded to. Box 112 indicates the end of the general flowchart.

Figure 8A:
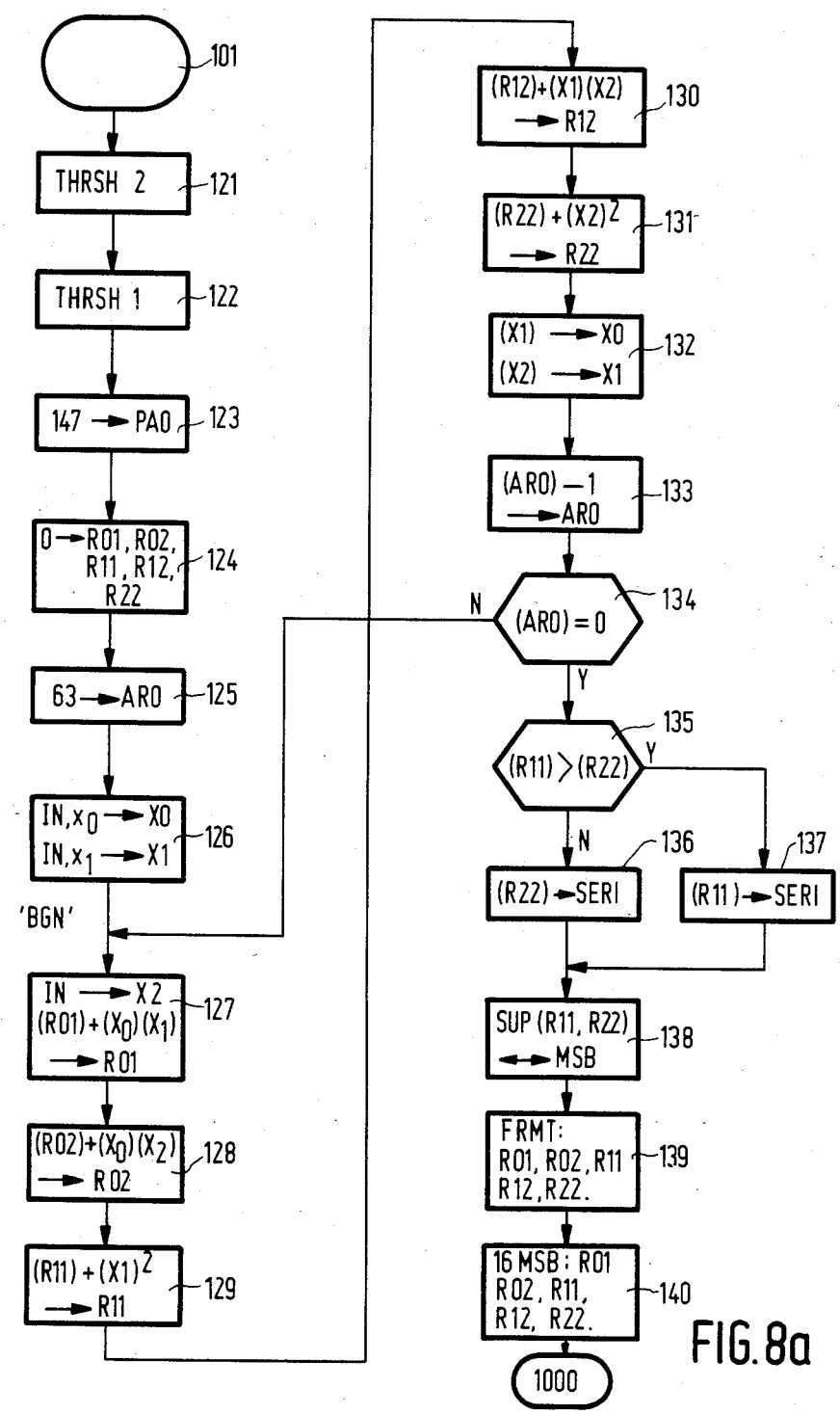
FIGS. 8a and 8b form a detailed flowchart explaining the functioning of the discriminator according to the invention.
Figure 8B:
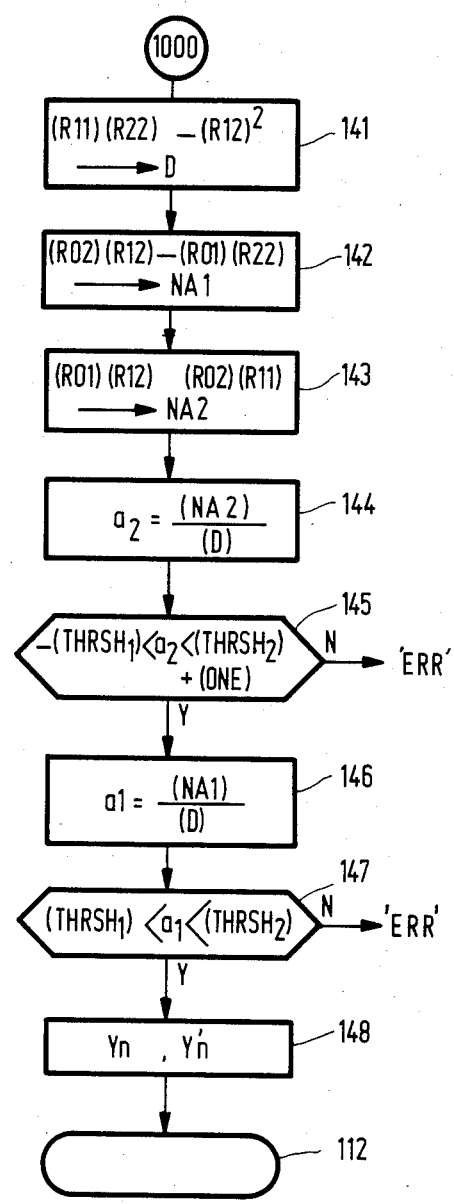

The flowchart in FIGS. 8a and 8b shows, between boxes 101 and 112, the more detailed progression of the flowchart in FIG. 7. Mathematical operations carried out in base two on the coefficients $R_{11}$ and $R_{22}$, as described below, enable these coefficients to be brought close to unity, without however standardizing them to 1, in order not to uselessly complicate the computations; consequently, it can be expected that the values determined subsequently for the coefficients $a_1$ and $a_2$ are not very close to 0 and 1 respectively. In practice, two positive threshold values are fixed $s_1$ and $s_2$ both close to 1, $s_1$ by default and $s_2$ by excess and it is required that, in order for the determination of the current output sample of the discriminator $y_n$ to be acceptable and declared valid, the values of the corresponding coefficients $a_1$ and $a_2$ must satisfy the following inequalities:

$$s_1 < a_2 < s_2 \qquad (26)$$

and $$-s_1 < a_1 < s_1 \qquad (27)$$

In the example described below, the values $s_1 = 0.8$ and $s_2 = 1.2$ are chosen. These two threshold values are in fact determined by experiment and can be changed at will in their respective 16-bit memory locations THRESHOLD 1 and THRESHOLD 2 during an operational calibration of the equipment. The decimal values 1.2 and 0.8 are produced from two respective values 1, contained in a memory location ONE and 3, which is 11 in binary, contained in a memory THREE. Firstly, the value 0.2 is determined by adding in the right hand section (fractional) of the accumulator the binary values 11, sucessively shifted towards the left by 4, 8 and 12 bits, which gives the binary value: 0.0011001100110011, a value very close to 0.2 in decimal, which is stored in the memory THRESHOLD 2 (box 121 in FIG. 8a).

The value $s_2 = 1.2$ is in fact subsequently obtained by concatenation of the respective contents of the memories ONE and THRESHOLD 2 ((ONE)+(THRESHOLD 2)). Similarly, the value 0.8 is obtained (box 122) by adding the binary values 11 successively shifted by 2, 6, 10 and 14 bits and the result 0.1100110011001111 is put into the memory THRESHOLD 1. As mentioned above, the 64 samples $x_n$ are placed in order of arrival of an external RAM, at memory locations 147 to 210 of port PA1, which forms means of accumulation, the oldest sample being in 147. By means of another port PAO used as a counter incremented by unity on each IN instruction of the program, the samples $x_n$ are thus successively read and temporarily placed in a transit memory X2 of the internal RAM of the microprocessor. For more details on this particular possibility of memory extension, the Texas Instruments TMS 32010 User's guide 1983, pages 6-2 and 6-3, incorporated here for reference, can be referred to. In box 123, a program memory SERI is loaded with the value 147 and this value is then transferred to port PAO as a start value for incrementation. The memories allocated to the coefficients $R_{01}$ to $R_{22}$, namely R01L, R01H, R02L, R02H, R11L, R11H, R12L, R12H, R22L and R22H, which form the first means of storage, the letter L each time indicating the 16 bits of the low section and the letter H indicating the 16 bits of the high section of each coefficient are initialized, i.e. loaded with the value 0 (box 124). The register ARO used as a loop counter for the computation of coefficients $R_{01}$ to $R_{22}$ is then loaded with the value 63 (box 125), then the first two samples $x_0$ and $x_1$ are tranferred from the port PA1 to the memories X0 and X1 respectively (box 126). At the "START" label, the next sample, namely $x_2$ is transferred into the memory X2 and the computation of the first term of each coefficient $R_{01}$ to $R_{22}$ according to the following expressions can then take place:

$(R_{01}) + (X0) \times (X_1) \longrightarrow R01$ (31) (box 127)

$(R_{02}) + (X0) \times (X_2) \longrightarrow R02$ (32) (box 128)

$(R_{11}) + (X1)^2 \longrightarrow R11$ (33) (box 129)

$(R_{12}) + (X1) \times (X2) \longrightarrow R12$ (34) (box 130)

$(R_{22}) + (X_2)^2 \longrightarrow R22$ (35) (box 131)

In box 132 the following transfers between memories are carried out: $(X1) \rightarrow X0$ and $(X_2) \rightarrow X1$. At 133, the auxiliary register ARO is decremented by unity and the new content of ARO (62) is tested in box 134. As this content is positive the "START" label is returned to, memory X2 is loaded with the next sample, namely $x_3$ and the second term of the coefficients $R_{01}$ to $R_{22}$ is computed and added to the previous ones (boxes 127 to 131), according to the expressions 31 to 35. The computing loop is carried out as many times as necessary, the memories R01L, Ro1H to R22L, R22H contain the value of the coefficients $R_{01}$ to $R_{22}$ respectively, the register ARO then reaches the value 0, the test ARO=0 in box 134 proves positive and an exit from the loop takes place. For the computation of the coefficients $R_{01}$ to $R_{22}$, it will be noted that the samples $x_0$ to $x_{63}$ are, in their respective memories, written in 12 bits. Consequently, each term of $x_u x_v$ type occupies a 24-bit format and the sum of 64 of these terms has a 30 bit format, which justifies the use of two memory locations (L and H) for the writing of each of the coefficients $R_{01}$ to $R_{22}$. In box 135 there is a test to find out which of the two coefficients $R_{11}$ or $R_{22}$ is the larger and, depending on whether it is $R_{22}$ (box 136) or $R_{11}$ (box 137), the program memory SERI is loaded with the high part of this largest value designated by SUP (R11, R22), i.e. with (R11H) or with (R22H). The continuation of the computation consists in loading the high part of the accumulator with (SERI) and in successively shifting this value by one bit to the left until a 1 appears in the MSB of the accumulator. If at the end of 15 successive shifts the MSB is still equal to 0, this indicates that (SERI)=0. It is then considered that the determination of $y_n$ is bad because it would be obtained from sample values $x_0$ to $x_{63}$ which are too low, the computation of $y_n$ is not contained and the "ERROR" label is proceeded to directly (which is not shown on FIG. 8a). In the most probable case, the value 1 in the MSB is obtained at the end of a whole number r of shifts ($r<15$) and an exit from the computing loop takes place which operates the successive shifts at the rate of one per cycle. In order to carry out this computing loop (not shown) the decrementation of the auxiliary register AR1 may be used, for example, which is initially loaded with the value 15 and the auxiliary register AR0 intended to register the value r after exiting from the loop. The procedure then goes on, in box 139, to another computing loop which serves to shift all the values of coefficients $R_{01}$ to $R_{22}$ by r bits to the left. To do this, the decrementation of the auxiliary register AR0 is used which is initially loaded with the value r. At this stage of computation, the contents of the memories R01H, R02H, R12H and R22H which are considered to represent the whole values of the associated coefficients, are in a 16-bit format, the largest of them using the 16 bits. It is therefore possible to envisage completely ignoring the fractional parts of the coefficients $R_{01}$ to $R_{22}$ contained in the memories R01L to R22L respectively but, preferably, an additional rounding is carried out which consists in weighting by 1 positively and negatively respectively, depending on the positive or negative sign respectively of the corresponding coefficient, the most significant bit of the low part of this coefficient, after which only the new high part of the coefficient (after increasing or reducing by unity respectively) is retained for the rest of the calculations in order to simplify them (box 140). The computation continues (FIG. 8b) with the determination of the coefficients $a_1$ and $a_2$. Firstly, the common denominator of $a_1$ and $a_2$ is computed according to the expression:

$$(R11H) \times (R22H) - (R12H)^2 \longrightarrow D \quad (36) \text{ (box 141-FIG. 8b)}$$

Similarly, the respective numerators of the coefficients $a_1$ and $a_2$ which are stored in memories NA1 and NA2 respectively are then computed, according to the expressions:

$$(R01H) \times (R12H) - (R01H) \times (R22H) \longrightarrow$$

NA1H, NA1L (37) box 142)

-continued
$$(R01H) \times (R12H) - (R02H) \times (R11H) \longrightarrow$$

NA2H, NA2L (38) box 143)

For the three operations described above, it will be noted that the partial products of the type (R11H)×(R22H) take, in register P and the accumulator of the microprocessor, a 32-bit format, as do the differences between partial products. In order to simplify the subsequent computations, only the content of the 16 bits of the high part of the accumulator (whole part) is stored in the memory after possible rounding, for the common denominator, while the respective values of the numerators of $a_1$ and $a_2$ are each stored in two memory locations (whole part and fractional part). The value of the coefficient $a_2$ is computed by division:

$$a_2 = \frac{(NA2)}{(D)} \qquad (39)(\text{box } 144)$$

The result of the division which uses 32-bit dividends is stored in two memories associated with the division subroutine DIV32, QUOTIM (whole part) and QUOTIL (frational part). After this it is first checked that the result is positive using the test (QUOTIM)>0, which is implicit by virtue of the above inequality (26). If this is not the case the "ERROR" label is used. For (QUOTIM)>0, the convergence test of the inequality (26) is carried out (box 145) i.e. the following operations are carried out successively:

(QUOTIM)+(QUOTIL)−(THRESHOLD 1)

If the result of this operation is negative, the "ERROR" label is used, otherwise the test is continued with:

(QUOTIM)+(QUOTIL)−(THRESHOLD 2)−(ONE)×$2^{16}$

If the result of this operation is positive, the "ERROR" label is used, otherwise the computation of $a_1$ is effected:

$$a_1 = \frac{(NA1)}{(D)} \qquad (41)(\text{box } 146)$$

The result of the division is stored as before in the QUOTIM and QUOTIL memories (in the place of $a_2$) which form second means of storage. In order for the value of $a_1$ to be acceptable, i.e. sufficiently close to 0 by positive or negative values, it is checked that it satisfies the inequality test (27) (box 147), i.e. the sign of $a_1$ is first tested:

if (QUOTIM)+(QUOTIL)>0 the operation is carried out:

(QUOTIM)+(QUOTIL)−(THRESHOLD 1)

if this result is positive "ERROR" is used, otherwise ((QUOTIM)+(QUOTIL)>0), the operation is carried out:

(QUOTIM)+(QUOTIL)+(THRESHOLD 1)

if this result is negative, "ERROR" is used, otherwise the computation of $a_1$ is declared valid and the computation of $y_n$ can then be effected.

In the present example of embodiment it is preferred to compute the value of $y_n$ by application of the above formula (22)', giving, using the notations chosen for the description of the flowchart in FIG. 8:

$$y_n = K_1 \frac{(NA_1)}{\sqrt{(NA2) \times (D)}} \quad (42)$$

where $$K_1 = \frac{f_0}{\pi \Delta F} \quad$$

$K_1$ is a multiplicative constant that can generally be omitted. In fact, the ultimate aim of the discrimination carried out on the composite VOR signal which constitutes the preferred application of the invention consists in the real time determination of the phase called the reference phase of this signal. This purpose is achieved by isolating a 30 Hz frequency line, this single sinusoid being obtained in the form of $y_n$ ordinate points provided at regular intervals. From the values of $y_n$ it is then possible, using a digital method, an example of which is given below, to extract the amplitude and phase of the sought line. Now, the coefficient $K_1$ only affects the value of the amplitude while it is basically the phase which is sought. Also, it will be noted that the correct value of the amplitude can be obtained at the end of the computations by bringing the multiplicative coefficient $K_1$ into effect only at this stage. The value $y'_n$ representing $y_n$ actually calculated is therefore:

$$y'_n = \frac{(NA1)}{\sqrt{(NA2) \times (D)}} \quad (44)$$

For this, the following operation is first carried out $$(NA2) \times (D) \rightarrow P$$

Given the format (NA2) which is in fact a 32-bit format, in the memories NA2H and NA2L, rounding is preferably first carried out, by adding 1 just after the point, after which only the 16 MSB are stored in memory NA2H and it is this latter value which is used for the multiplication mentioned above. The result is supplied in 32 bits to the register P. A subroutine RACAR is then called which carries out the operation:

$$(NA2) \times (D) \rightarrow X$$

X being a memory location which therefore contains 16 bits.

After this, NA1, is transferred from memory locations DLOWM and DLOWL to the accumulator and the final operation indicated by expression (44) is carried out by calling a subroutine DIV 32. The value of $y'_n$ thus obtained is stored in the form of a whole part in 16 bits and a fractional part in 16 bits in memories QUOTIM and QUOTIL respectively which form the second means of storage.

The digital method used to extract the phase of the signal at 30 Hz is, preferably, the method called the "recursive discrete Fourier transform" or "recursive DFT" method which is explained in its general principles in the appendix. The problem raised reduces to computing:

$$Y(k) = \sum_{q=0}^{M-1} y_q e^{-j2\pi \frac{q \cdot k}{M}} \quad (45)$$

$$Y(k) = a e^{j\phi} \quad (46)$$

$Y(k)$ being a complex number which represents in amplitude (a) and in phase ($\phi$) the 30 Hz spectral line which is in question.

In the expression (45):

M is the whole number of distinct successive values $y_n$ chosen for the computation, representing several sinusoids of the modulating 30 Hz signal, for example M=83 (12 sinusoids for a frequency $f_e/N$ of 207.5 Hz of output samples ($y_n$);

k is such that $$\frac{k}{M} = \frac{F \times N}{f_e}$$

giving, with the previously chosen values:

$$k = \frac{83 \times 30 \times 64}{12380}$$

$k = 12$

It is desired to determine Arg $Y(k)$ and $|Y(k)|$. To do this use may be made of the fast algorithm given in the appendix and defined by:

$v_{-1} = 0$
$v_{-2} = 0$
for
$q = 0$ to $M-1$ $$v_q = y_q + 2 \cos \frac{2k\pi}{M} \cdot v_{q-1} - v_{q-2} \quad (47)$$

after M values (real) of $v_q$ have been computed:

$$Y(k) = e^{+j2\pi \frac{k}{M}} v_{M-1} - v_{M-2} \quad (48)$$

For each sample $y_n$ (i.e. $y_q$ when working with respect to M) at the output of the discriminator 5, the computation of the corresponding $v_q$ according to expression (47), in the considered section 0 to M−1, therfore takes place:

In practice, in order to be able to double the refresh rate of the memories, it is preferred to interlace by 50% the determination of $Y(k)$, i.e. for each values of $y_q$ two values of $v_q$ are computed, a first $v_q$ value resulting from a pair of earlier values $V_{q-1}$, $v_{q-2}$, previously calculated and respectively contained in the memories V1 and V2 and a second $v_q$ value resulting from another pair of earlier different values $v_{q-1}$, $v_{q-2}$ contained in memories V10 and V20 respectively. The interlacing is such that, when the position is maximum for a pair of values $v_{q-1}$, $v_{q-2}$ or M−1 and M−2 (82 and 81) and is suitable for the associated value of $Y(k)$ to be computed according to formula (48), the position of the other pair of values $v_{q-1}$, $v_{q-2}$ is equal to M−1/2 and M−3/2 (41 and 40) for the other pair of values $v_{q-1} \cdot v_{q-2}$.

The ports PA1 and PA0, respectively working as an external RAM and as a counter with initial setting and associated incrementation, can again be used for placing the values $v_{q-1}$, $v_{q-2}$ and $v_q$ necessary for the computations into memory.

Figure 9:
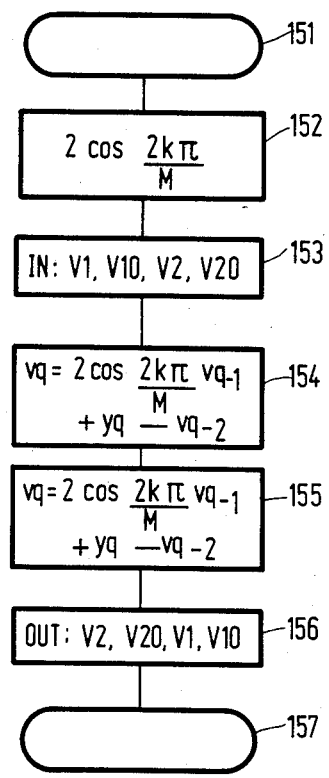
FIG. 9 is the computing flowchart of an element of the series $v_q$ associated with the series $v_{q'}$.

The flowchart in FIG. 9 shows the computation of the two $v_q$ values associated with each $y_q$ value. Box 151 indicates the start of the program which, preferably, follows the program of computing $y_n$ (FIGS. 8a and 8b). In box 152 the value of 2 cos $2k\pi/M$ is read. This value, which for example is stored in memory location 290 of PA1 is transferred, by means of PA0 to location RXN9H of the internal data memory of the TMS 32010 microprocessor. In box 153 the contents of memory locations 608, 609, 610, 611 are transferred in a similar way by a series of IN instructions into memories V1, V10, V2, V20 respectively of the microprocessor. Box 154 symbolizes the following operations for the so-called recent DFT computing sequence which concerns (V1) and (V2):

(V1)×(RXN9H)→ACC
(ACC)+(QUOTIM)→ACC
(ACC)−(V2)→ACC
(ACC)→V2 which carries out the literal operation:

$$v_q = a_{1q} + 2 \cos 2k\pi/M \cdot v_{q-1} - v_{q-2}$$

or the operation:

$$v_q = \frac{a_{1q}}{\sqrt{a_{2q}}} + 2 \cos 2 \frac{k\pi}{M} \cdot v_{q-1} - v_{q-2}$$

The new content of V2 thus changes from the value $v_{q-2}$ to the value $v_q$ (V1) remaining unchanged at this stage. Box 155 symbolizes the same operation as in box 154 but for the so-called more than 50% DFT computation sequence which concerns V10 and V20. The new content of V20 thus changes from the value $v_{q-2}$ to the value $v_q$, (V10) remaining unchanged at this stage.

In box 156, PA0 is loaded with the value 608 and then, by a series of OUT instructions, the contents of memory locations V2, V20, V1 and V10 respectively are transferred in this order into memory locations 608, 609, 610 and 611 respectively of port PA1.

By means of this latter storage operation the necessary substitutions are made in order to change from the values $v_q$, $v_{q-1}$ to the values $v_{q-1}$, $v_{q-2}$, for each pair of adjacent values v, which is necessary for the purpose of the following computation (FIGS. 8a, 8b and 9) which is precisely characterized by an increase by 1 of the mute indices n (FIGS. 8a, 8b) and q (FIG. 9). Box 157 marks the end of the computation and the return to box 123 (FIG. 8a) for the computation of the following values of $y_n$ ($y_q$), $v_q$ and $v_{q-1}$. A count, which is not explained here, indicates which pairs $v_{q-1}$, $v_{q-2}$, are identified with the pairs $v_{M-1}$ and $v_{M-2}$ from which the values of Y(k) are computed each time, according to expression (48), Y(k) being a complex number from which can be extracted the modulus and particularly the argument $\phi$ which is extremely helpful to known. This computation, which is specialist in the field is capable of programming, is carried out by the TMS 32010 microprocessor and each value of $\phi$, called $\phi_{ref}$ is then transferred by the data bus according to a certain protocol to a FIFO memory forming the second means of storage, called the results FIFO memory. By connecting, (in a way that is not shown) an instruction FIFO memory arranged in parallel with respect to the results FIFO memory on the data bus, a buffer memory element can be created between the TMS 32010 used as a slave microprocessor and another microprocessor used as a master microprocessor, a MOTOROLA 6809 for example, the latter synchronized with the TMS 32010, capable of using the results contained in the results FIFO memory and also carrying out management tasks which are outside the scope of the invention. The information available at the "ERROR" label is transmitted by the results FIFO to the master microprocessor which then decides upon the possible modification of the values of the $s_1$ or $s_2$ thresholds or the increased amplification to be given to the analog input signal or a predetermined delay to be observed before repeating the computations which the discriminator 5 must carry out.

It has been seen above, with reference to FIG. 1, that in the presence of an input signal having too much noise it was advantageous to introduce a pre-filtering by means of an input filter 6. The inclusion of the filter 6 in the circuit can be controlled by an appropriate signal on the conductor 4 from the TMS 32010 microprocessor itself, which is represented in FIG. 1 by the broken line 11; instead of the value of the S/N ratio a value representing the noise power $\sigma^2$ can be used and the switch 3 can be activated in the position shown in FIG. 1 when this representative value exceeds a certain threshold S" to be determined during the equipment test. As a representative value of $\sigma^2$, expression (24) is chosen:

$$\sigma^2 = 1/N(R_0 + a_1 R_{01} + a_2 R_{02}) \quad (49)$$

The coefficient $R_{11}$ or the coefficient $R_{22}$ can be equally used for $R_0$ and, in order to carry out the computation according to expression (49), it is previously necessary to store the quantities $a_1$ and $a_2$ in their own memory locations in the microprocessor.

For the final computation of the phase of the signal to be discriminated, numerical methods other than the recursive DFT can be used, such as a method of least squares for example.

APPENDIX

In its most general form, expression (1) is written:

$$y(t) = c + a \sin(\omega t + \phi) + b_t \quad (50)$$

where
t: time of arrival of the sample
c: d.c. component
$b_t$: zero average additive noise
In vector form, the expression (50) is written $$y(t) = [1 \sin \omega t \cos \omega t] \times \begin{bmatrix} c \\ a \cos \phi \\ a \sin \phi \end{bmatrix} + b_t$$

or again:

$$y_t = H_t X + b_t \quad (51)$$

where:
$H_t = [1 \sin \omega t \cos \omega t]$ and
$X = [c \ a \cos \phi \ a \sin \phi]^T$
The problem consists in estimating the quantities c, a and $\phi$, i.e. the vector X assuming stationary or pseudo-stationary conditions.

Multiplying both sides of equation (51) by $H_t^T$ there is obtained:

$$H_t^T y_t = H_t^T H_t X + H_t^T b_n$$

Accomulating over M points:

$$\sum_{t=0}^{M-1} H_t^T y_t = \sum_{t=0}^{M-1} H_t^T H_t X + \sum_{t=0}^{M-1} H_t^T b_n$$

the noise $b_n$ being of zero average and not correlated with the terms in sin t and cos t, can be ignored and the result is:

$$\sum_{t=0}^{M-1} H_t^T y_t = P X$$

$$P = \sum_{t=0}^{M-1} H_t^T H_t$$

being a symmetrical square matrix, and:

$$X = P^{-1} Z$$

where $$z = \sum_{t=0}^{M-1} H_t^T y_t$$

a and $\phi$ can then be extracted by calculating P and Z and by solving the matrix equation:

$$x = P^{-1} Z$$

It will be noted that, assuming an equidistribution or regular distribution of observation times $t_q$ and observation duration $T_1$ that is a multiple of the analysed signal period $T(T=2\pi/\omega)$, it can be shown that the matrix P tends towards a diagonal matrix:

$$P = \begin{bmatrix} M & 0 & 0 \\ 0 & M/2 & 0 \\ 0 & 0 & M/2 \end{bmatrix}$$

Assuming the interval between samples as being constant, for M regularly spaced points during the interval $T_1$, the expression of sampling times $t_1$ becomes:

$$t_q = q(T_1/M)$$

The Z column vector is then written:

$$Z = \begin{bmatrix} \sum_{q=0}^{M-1} y\left(q \frac{T_1}{M}\right) \\ \sum_{q=0}^{M-1} y\left(q \frac{T_1}{M}\right) \sin \omega q \frac{T_1}{M} \\ \sum_{q=0}^{M-1} y\left(q \frac{T_1}{M}\right) \cos \omega q \frac{T_1}{M} \end{bmatrix}$$

As the duration of observation is a multiple of the period of the component which it is desired to estimate, $$T_1 = kT = k2\pi/\omega$$

can be written, k being an integral multiplicative factor
Z is then written:

$$Z = \begin{bmatrix} \sum_{q=0}^{M-1} y\left(q \frac{T_1}{M}\right) \\ \sum_{q=0}^{M-1} y\left(q \frac{T_1}{M}\right) \sin 2\pi \frac{k}{M} q \\ \sum_{q=0}^{M-1} y\left(q \frac{T_1}{M}\right) \cos 2\pi \frac{k}{M} q \end{bmatrix} = \quad (53)$$

$$\begin{bmatrix} Y(0) \\ \frac{1}{2j} \{Y(-k) - Y(k)\} \\ \frac{1}{2} \{Y(-k) + Y(k)\} \end{bmatrix}$$

PS Y(k) designates the DFT (Discrete Fourier Transform) of the series $y(q T_1/M)$ for values of q from 0 to $M-1$.

Expression (52) becomes:

$$X = \frac{1}{M} \begin{bmatrix} 1 & 0 & 0 \\ 0 & 2 & 0 \\ 0 & 0 & 2 \end{bmatrix} \times \begin{bmatrix} Y(0) \\ 1/2j \{Y(-k) - Y(k)\} \\ 1/2 \{Y(-k) + Y(k)\} \end{bmatrix}$$

or again $$X = \begin{bmatrix} \frac{Y(0)}{M} \\ \frac{1}{M} \times \frac{1}{j} \{Y(-k) - Y(k)\} \\ \frac{1}{M} \times \{Y(-k) + Y(k)\} \end{bmatrix}$$

The computation of X therefore can be summed up in the knowledge of the lines of order 0 and k in the DFT of the series $y(q T_1/M)$. In order to find the complex number Y(k) it is preferable to use a recursive DFT method. It will be noted that knowledge of Y(k) is sufficient for estimating the vector X. In fact, $$|Y(k)| = |Y(-k)|$$

and $$\text{Arg } Y(-k) = -\text{Arg } Y(k)$$

can be written, which means to the nearest multiplicative factor 2/M there is:

$$|Y(k)| = a$$

and $$\text{Arg } Y(k) = \phi - \pi/2$$

The problem can be summed up by estimating Y(k) such that:

$$Y(k) = \sum_{q=0}^{M-1} y\left(q \frac{T_1}{M}\right) e^{-j2\pi \frac{qk}{M}}$$

To facilitate the writing, this is put as:

$$y(q) = y(q - T_1/M)$$

$$W = e^{-j2\pi \frac{k}{M}}$$

from which $$Y(k) = \sum_{q=0}^{M-1} y(q) W^q$$

It is noted that Y(k) is a polynomial in powers of W whose coefficients are the samples of the received signal.

Y(k) is broken down in order to make the various samples in the series y(0), y(1), ..., y(q), ..., y(M−1) appear. This is put as:

$$z(0) = y(0)$$

$$z_q = z_{q-1} \times W^{-1} + y(q)$$

$$\theta = 2k\pi/M$$

(from which: $W = e^{-j\theta}$ $$z_q = v_q - j^0 v_{q-1}$$

With all computations complete, the following is deduced from them:

$$v_q = y(q) + 2\cos\theta \, v_{q-1} - v_{q-2}$$

where:
$v_{-1} = 0$ and $v_{-2} = 0$
$Y(k) = e^{-j\theta} v_{M-1} - v_{M-2}$

Finally the following algorithm is obtained: initialization:

$$v_{-1} = 0$$
$$v_{-2} = 0$$

on each received sample y(q):

$v_q = y(q) + 2\cos(2k\pi/M)v_{q-1} - v_{q-2}$ (real value)

at the end of the sequence of observations:

$Y(k) = e^{+j2\pi/M} v_{M-1} - v_{M-1}$ (complex value)

It will be noted that the reduction in the number of operations with respect to the standard DFT strengthens the possibility of a so-called on-line computation, i.e. inserted in the time intervals between samples. This enables the value of y(k) associated with the M previous samples to be obtained shortly after reception of the last sample (or order M−1). Also, this on-line computation is accompanied by a significant reduction in the memories necessary for the computation. This reduction is even greater in this case than in other recursive methods because of the small number of variables.

What is claimed is:

1. A digital frequency discriminator for extracting from a FM signal having a carrier frequency of $f_o$ at least one low frequency sinusoidal signal of frequency F which frequency modulates the carrier with a modulating frequency excursion $\Delta F$, the value of $f_o$ and $\Delta F$ being known, characterized in that said discriminator comprises:

(a) means for selectively pre-filtering digital samples $e_n$ of the FM signal to produce samples $x_n$ modulated at a frequency $f_e = 4f_o$;

(b) accumulation means for accumulating, in an interval between two successive times $t_q$ and $t_{q+1}$, N successive ones of the digital samples $x_n$ which form an analysis window, the frequency of the modulated signal being considered constant during this interval;

(c) first storage means for storing coefficients $R_{01}$, $R_{02}$, $R_{11}$, $R_{12}$ and $R_{22}$ defined by:

$$R_{01} = \sum_{n=0}^{N-1} x_n \cdot x_{n-1}$$

$$R_{02} = \sum_{n=0}^{N-1} x_n \cdot x_{n-2}$$

$$R_{11} = \sum_{n=0}^{N-1} x_{n-1}^2$$

$$R_{12} = \sum_{n=0}^{N-1} x_{n-1} \cdot x_{n-2}$$

$$R_{22} = \sum_{n=0}^{N-1} x_{n-2}^2$$

(d) computing means for determining the quantity $a_1$ defined by:

$$a_1 = \frac{R_{02}R_{12} - R_{01}R_{22}}{R_{11}R_{22} - R_{12}^2}$$

the quantity $a_1$ approximating the ordinate of a point on a curve representing the low frequency sinusoidal signal; and (e) second storage means for storing the value of $a_1$, while the computing means determines a quantity approximating the ordinate of a subsequent point on the curve.

2. A digital frequency discriminator as in claim 1 including:

(a) second computing means for determining the quantity $a_2$ defined by:

$$a_2 = \frac{R_{01}R_{12} - R_{02}R_{11}}{R_{11}R_{22} - R_{12}^2}$$

the quantity $a_2$ indicating convergence; and (b) comparison means for comparing the quantity $a_2$ with two thresholds $s_1$ and $s_2$, $a_1$ being transferred into the second storage means only if $s_1 < s_2 < s_2$.

3. A digital frequency discriminator as in claim 2 including third computing means for determining the quantity $\sigma^2$ representing the noise power of the sampled signal and defined by:

$$\sigma^2 = 1/N(R_0 + a_1 R_{01} + a_2 R_{02}).$$

4. A digital frequency discriminator as in claim 1, 2 or 3 where the means for selectively prefiltering the digital samples $e_n$ comprises a bandpass filter having a center frequency $f_o$ for prefiltering the samples $e_n$ when the noise power of the modulated carrier is detected as being lower than a threshold S" which corresponds to a value of the signal-to-noise ratio on the order of 15 dB.

5. A digital frequency discriminator as in claim 4 where the bandpass filter comprises means for performing an elementary band-pass filtering of the type:

$$x_n = \tfrac{1}{8}(e_n - e_{n-2} + e_{n-4} - e_{n-6} + e_{n-8} - e_{n-10} + e_{n-12} - e_{n-14})$$

where $e_n$ to $e_{n-14}$ designate the digital samples of the carrier.

6. A digital frequency discriminator as in claim 1, 2 or 3 including fourth computing means for determining the quantity:

$$v_q = a_{1q} + 2\cos 2k\pi/M \, v_{q-1} - v_{1-2},$$

where the quantity $a_{1q}/\sqrt{a_{2q}}$ can be substituted for $a_{1q}$, and where $v_{-2} = v_{-1} = 0$, the index q varying from 0 to $M-1$, and k and M being positive integers such that:

$$\frac{k}{M} = \frac{F \times N}{f_e}.$$

7. A digital frequency discriminator as in claim 1, 2 or 3 for extracting a reference phase contained in composite VOR signal received by a VOR-ILS equipment, by point-by-point restoration of a 30 Hz sinusoidal signal defining said reference phase, where $f_o = 9960$ Hz and $\Delta_F = 480$ Hz.

8. A digital frequency discriminator as in claim 1, 2 or 3 for extracting a reference phase contained in a composite VOR signal received by a VOR-ILS equipment, by point-by-point restoration of a 30 Hz sinusoidal signal defining said reference phase, where $f_o = 3320$ Hz, and further including:

(a) an analog one-way filter of order less than or equal to three for filtering a 9960 Hz carrier of the VOR signal, said one-way filter having a pass band between 0 and 10600 Hz and having a transition band between 10600 Hz and 15960 Hz;

(b) means for sampling a signal obtained at an output of the one-way filter at a frequency of 26560 Hz; and (c) a half-band filter having 4 distinct coefficients for filtering the samples, and having a high pass output connected to the input of the digital discriminator.

* * * * *